(12) United States Patent
Direcks et al.

(10) Patent No.: US 8,351,018 B2
(45) Date of Patent: Jan. 8, 2013

(54) FLUID HANDLING STRUCTURE, LITHOGRAPHIC APPARATUS AND DEVICE MANUFACTURING METHOD

(75) Inventors: Daniel Jozef Maria Direcks, Simpelveld (NL); Danny Maria Hubertus Philips, Son en Breugel (NL); Clemens Johannes Gerardus Van Den Dungen, Eindhoven (NL); Koen Steffens, Veldhoven (NL); Arnold Jan Van Putten, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 525 days.

(21) Appl. No.: 12/436,626

(22) Filed: May 6, 2009

(65) Prior Publication Data
US 2009/0279060 A1    Nov. 12, 2009

Related U.S. Application Data

(60) Provisional application No. 61/071,621, filed on May 8, 2008, provisional application No. 61/129,717, filed on Jul. 14, 2008.

(51) Int. Cl.
*G03B 27/52* (2006.01)
(52) U.S. Cl. ............... 355/30; 355/67; 355/77
(58) Field of Classification Search ........... 355/30, 355/50, 53, 67, 77
See application file for complete search history.

(56) References Cited

U.S. PATENT DOCUMENTS

| | | | |
|---|---|---|---|
| 4,509,852 A | 4/1985 | Tabarelli et al. | |
| 7,127,831 B2 * | 10/2006 | Garcia et al. | 34/407 |
| 7,292,313 B2 | 11/2007 | Poon et al. | |
| 7,423,720 B2 * | 9/2008 | Verspay et al. | 355/30 |
| 7,443,482 B2 | 10/2008 | Novak et al. | |
| 7,561,248 B2 | 7/2009 | Nakano | |
| 7,602,470 B2 | 10/2009 | Kemper et al. | |
| 7,710,537 B2 * | 5/2010 | Verspay et al. | 355/30 |
| 7,839,483 B2 | 11/2010 | Leenders et al. | |
| 7,932,989 B2 | 4/2011 | Novak et al. | |
| 2004/0136494 A1 | 7/2004 | Lof et al. | |
| 2004/0207824 A1 | 10/2004 | Lof et al. | |
| 2005/0213066 A1 | 9/2005 | Sumiyoshi | |
| 2006/0023183 A1 * | 2/2006 | Novak et al. | 355/53 |
| 2006/0087630 A1 | 4/2006 | Kemper et al. | |
| 2006/0103821 A1 * | 5/2006 | Hendricus Verspay et al. | 355/53 |
| 2006/0119809 A1 | 6/2006 | Verhagen et al. | |
| 2006/0291060 A1 | 12/2006 | Shirai et al. | |
| 2007/0081140 A1 | 4/2007 | Beckers et al. | |

(Continued)

FOREIGN PATENT DOCUMENTS

EP    1420298 A2    5/2004

(Continued)

OTHER PUBLICATIONS

Japanese Office Action mailed Aug. 1, 2011 in corresponding Japanese Patent Application No. 2009-112566.

(Continued)

*Primary Examiner* — Thomas R Artman
(74) *Attorney, Agent, or Firm* — Pillsbury Winthrop Shaw Pittman LLP

(57) ABSTRACT

A fluid handling structure is disclosed in which measures are taken to increase the speed at which meniscus breakdown occurs. Measures include the shape of a plurality of fluid extraction openings and the shape and density of a plurality of fluid supply openings in the fluid handling structure.

19 Claims, 12 Drawing Sheets

U.S. PATENT DOCUMENTS

| | | |
|---|---|---|
| 2007/0146666 A1 | 6/2007 | Leenders et al. |
| 2007/0268466 A1 | 11/2007 | Leenders et al. |
| 2008/0007704 A1* | 1/2008 | Leenders et al. ............... 355/30 |
| 2008/0212046 A1* | 9/2008 | Riepen et al. ................... 355/30 |
| 2008/0266533 A1 | 10/2008 | Nagasaka et al. |
| 2009/0147227 A1* | 6/2009 | Steffens et al. ................. 355/53 |
| 2009/0174871 A1* | 7/2009 | Petrus De Jong et al. ...... 355/30 |
| 2009/0279060 A1* | 11/2009 | Direcks et al. .................. 355/30 |
| 2009/0279062 A1* | 11/2009 | Direcks et al. .................. 355/30 |
| 2009/0279063 A1* | 11/2009 | Riepen et al. ................... 355/30 |
| 2009/0296053 A1 | 12/2009 | Poon et al. |
| 2010/0085545 A1* | 4/2010 | Direcks et al. .................. 355/30 |
| 2010/0277859 A1* | 11/2010 | Wang et al. ............. 361/679.21 |
| 2010/0313974 A1* | 12/2010 | Riepen et al. ................... 137/560 |
| 2011/0013158 A1* | 1/2011 | Philips et al. ................... 355/30 |
| 2011/0090472 A1* | 4/2011 | Riepen et al. ................... 355/30 |
| 2011/0134400 A1 | 6/2011 | Shibazaki |
| 2011/0134401 A1* | 6/2011 | Rops et al. ...................... 355/30 |
| 2011/0188012 A1* | 8/2011 | Direcks et al. .................. 355/30 |
| 2011/0194084 A1* | 8/2011 | Riepen et al. ................... 355/30 |
| 2011/0199593 A1* | 8/2011 | Riepen et al. ................... 355/30 |
| 2011/0216292 A1* | 9/2011 | Lafarre et al. ................... 355/30 |
| 2011/0255062 A1* | 10/2011 | Philips et al. ................... 355/30 |
| 2011/0261332 A1* | 10/2011 | Cortie et al. .................... 355/30 |
| 2012/0069309 A1* | 3/2012 | Willems et al. ................. 355/30 |

FOREIGN PATENT DOCUMENTS

| | | |
|---|---|---|
| EP | 1420300 A2 | 5/2004 |
| EP | 1 571 698 | 7/2005 |
| JP | 2005-191344 | 7/2005 |
| JP | 2006-060223 | 3/2006 |
| JP | 2006-140494 | 6/2006 |
| JP | 2006-523029 | 10/2006 |
| JP | 2007-504662 | 3/2007 |
| JP | 2007-142460 | 6/2007 |
| JP | 2007-194613 | 8/2007 |
| JP | 2007-318117 | 12/2007 |
| WO | 99/49504 A1 | 9/1999 |
| WO | 2005/029559 | 3/2005 |
| WO | 2005/064405 A2 | 7/2005 |
| WO | 2005/081290 | 9/2005 |
| WO | 2006/101120 | 9/2006 |

OTHER PUBLICATIONS

Japanese Office Action mailed Sep. 5, 2011 in corresponding Japanese Patent Application No. 2009-113348.
Singapore Written Opinion and Search Report dated Aug. 1, 2012 in corresponding Singapore Patent Application No. 201103843-7.
Japanese Office Action mailed Nov. 8, 2012 in corresponding Japanese Patent Application No, 2009-113348.
Chinese Office Action dated Oct. 25, 2012 in corresponding Chinese Patent Application No. 200910140581.8.

* cited by examiner

FLUID HANDLING STRUCTURE, LITHOGRAPHIC APPARATUS AND DEVICE MANUFACTURING METHOD

This application claims priority and benefit under 35 U.S.C. §119(e) to U.S. Provisional Patent Application Ser. No. 61/071,621, entitled "Fluid Handling Structure, Lithographic Apparatus and Device Manufacturing Method", filed on May 8, 2008, and to U.S. Provisional Patent Application Ser. No. 61/129,717, entitled "Fluid Handling Structure, Lithographic Apparatus and Device Manufacturing Method", filed on Jul. 14, 2008. The contents of those applications are incorporated herein in their entirety by reference.

FIELD

The present invention relates to a fluid handling structure, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although other liquids can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desired. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, such as an aromatic and/or a fluorohydrocarbon, and an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion liquid is handled by a fluid handling system or apparatus. In an embodiment the fluid handling system may supply immersion fluid and therefore be a fluid supply system. In an embodiment the fluid handling system may confine fluid and thereby be a fluid confinement system. In an embodiment the fluid handling system may provide a barrier to fluid and thereby be a barrier member. In an embodiment the fluid handling system may create or use a flow of fluid (such as gas), for example to help in handling liquid. In an embodiment, immersion liquid may be used as the immersion fluid. In that case, the fluid handling system may be a liquid handling system.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a –X direction, liquid is supplied at the +X side of the element and taken up at the –X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

FIG. 4 schematically depicts an exemplary liquid supply system for use in a lithographic projection apparatus, according to an embodiment of the present invention. A liquid is supplied by two groove inlets IN on either side of the projection system PL and is removed by a plurality of discrete outlets OUT, arranged radially outwardly of the inlets IN. In the embodiment of FIG. 4, inlets IN and outlets OUT are arranged within a plate having a hole through which a beam of radiation is projected. Liquid is supplied by one groove inlet IN on one side of the projection system PL and is removed by a plurality of discrete outlets OUT on the other side of the projection system PL, thereby causing a flow of a thin film of liquid between the projection system PL and the projection system PL. The choice of a combination of inlet IN and outlets OUT incorporated within the liquid supply system can depend on the direction of movement of the substrate W (the other combination of inlet IN and outlets OUT being inactive). Arrows in liquid supply and liquid recovery devices indicate the direction of liquid flow.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication no. WO 2005/064405 discloses an all wet arrangement in which the immersion liquid is unconfined. In such a system substantially the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system may improve temperature control and processing of the substrate, evaporation of the immersion liquid can still occur. One way of alleviating that problem is described in United States patent application publication no. US 2006/119809 in which a member is provided which covers the substrate W in all positions and which is arranged to have immersion liquid extending between it and the top surface of the substrate and/or substrate table which holds the substrate.

It is desirable to be able to move the substrate as fast as possible below the projection system. For this, the liquid confinement system or fluid handling system, especially for a localized area fluid handling system, should be designed to allow a high rate of scanning motion without significant liquid loss or formation of bubbles. It is desirable that stepping and scanning motions can be performed at a close or similar speed, if not substantially the same speed.

SUMMARY

It is desirable, for example, to provide a fluid handling system which maintains liquid in a space between the final element of the projection system and the substrate.

According to an aspect of the invention, there is provided a fluid handling structure for a lithographic apparatus, the fluid handling structure having a plurality of openings arranged in plan, in a cornered shape, the fluid handling structure configured such that the openings are directed, in use, towards a substrate and/or a substrate table configured to support the substrate, wherein a) the cornered shape has a side with a negative radius; and/or b) the cornered shape has a corner with a radius selected from the range of 0.05-4.0 mm.

According to an aspect of the invention, there is provided a fluid handling structure for a lithographic apparatus, the fluid handling structure having a plurality of fluid extraction openings arranged, in plan, in a first cornered shape, and a plurality of fluid supply openings arranged, in plan, in a second cornered shape, the fluid extraction openings and fluid supply openings being directed, in use, towards a substrate and/or a substrate table configured to support the substrate, the first and second cornered shapes being substantially similar, wherein a fluid extraction opening is present at the apex of at least one corner of the first cornered shape and/or a fluid supply opening is present at the apex of at least one corner of the second cornered shape.

According to an aspect of the invention, there is provided a fluid handling structure for a lithographic apparatus, the fluid handling structure having a plurality of openings arranged in plan, in a cornered shape, the fluid handling structure configured such that the openings are directed, in use, towards a substrate and/or a substrate table configured to support the substrate, wherein the openings are more closely spaced near a corner than elsewhere.

According to an aspect of the invention, there is provided a device manufacturing method, comprising:

providing a fluid between a projection system and a substrate;

retrieving liquid from between the substrate and the projection system by applying an under pressure to a plurality of openings in a fluid handling structure, the openings being arranged, in plan, in a cornered shape around the fluid between the projection system and the substrate, wherein a) the cornered shape has a side with a negative radius; and/or b) the cornered shape has a corner with a radius selected from the range of 0.05-4.0 mm.

According to an aspect of the invention, there is provided a device manufacturing method, comprising:

providing a fluid between a projection system and a substrate;

retrieving liquid from between the substrate and the projection system by applying an under pressure to a plurality of fluid extraction openings in a fluid handling structure, the fluid extraction openings being arranged, in plan, in a first cornered shape; and supplying fluid to between the substrate and the projection system through a plurality of fluid supply openings, the fluid supply openings arranged, in plan, in a second cornered shape, wherein the first and second cornered shapes are substantially similar and wherein a fluid extraction opening is present at the apex of at least one corner of the first cornered shape and/or a fluid supply opening is present at the apex of at least one corner of the second cornered shape.

According to an aspect of the invention, there is provided a device manufacturing method, comprising:

supplying liquid between a projection system and a substrate through a plurality of openings of a fluid handling structure, wherein the openings are arranged, in plan, in a cornered shape and the openings are more closely spaced near a corner than elsewhere.

According to an aspect of the invention, there is provided a fluid handling structure for a lithographic apparatus. The fluid handling structure has a plurality of fluid extraction openings arranged, in plan, in a first cornered shape, and a plurality of fluid supply openings arranged, in plan, in a second cornered shape. The fluid extraction openings and fluid supply openings being directed, in use, towards a substrate and/or a substrate table configured to support the substrate. The first and second cornered shapes are substantially similar. A corner of the first cornered shape, or of the second cornered shape, or of both, is configured to be aligned, in use, with a direction of relative motion between the fluid handling structure and the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
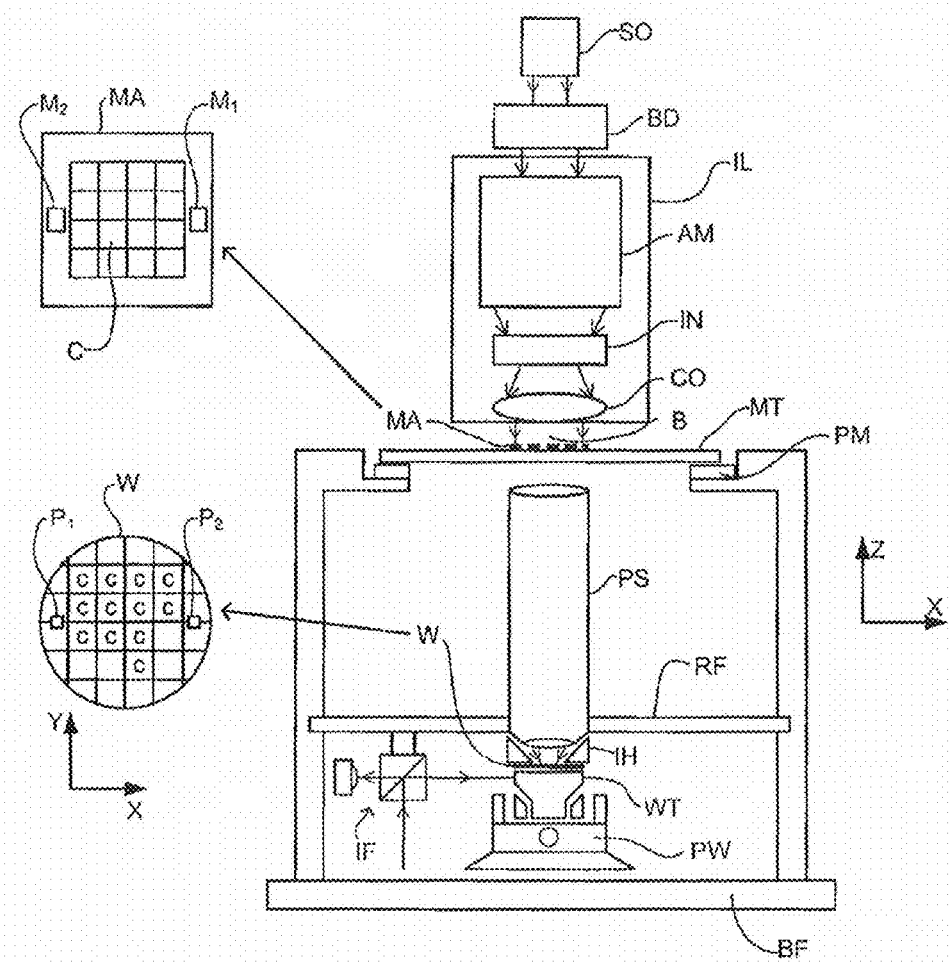
FIG. 1 depicts a lithographic apparatus according to an embodiment of the invention.
Figure 2:
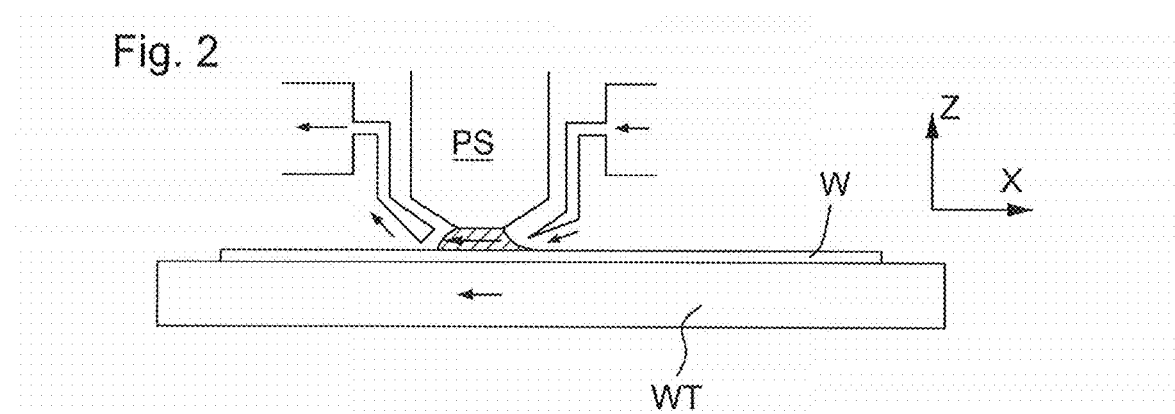
FIGS. 2 and 3 depict a liquid supply system for use in a lithographic projection apparatus.
Figure 3:
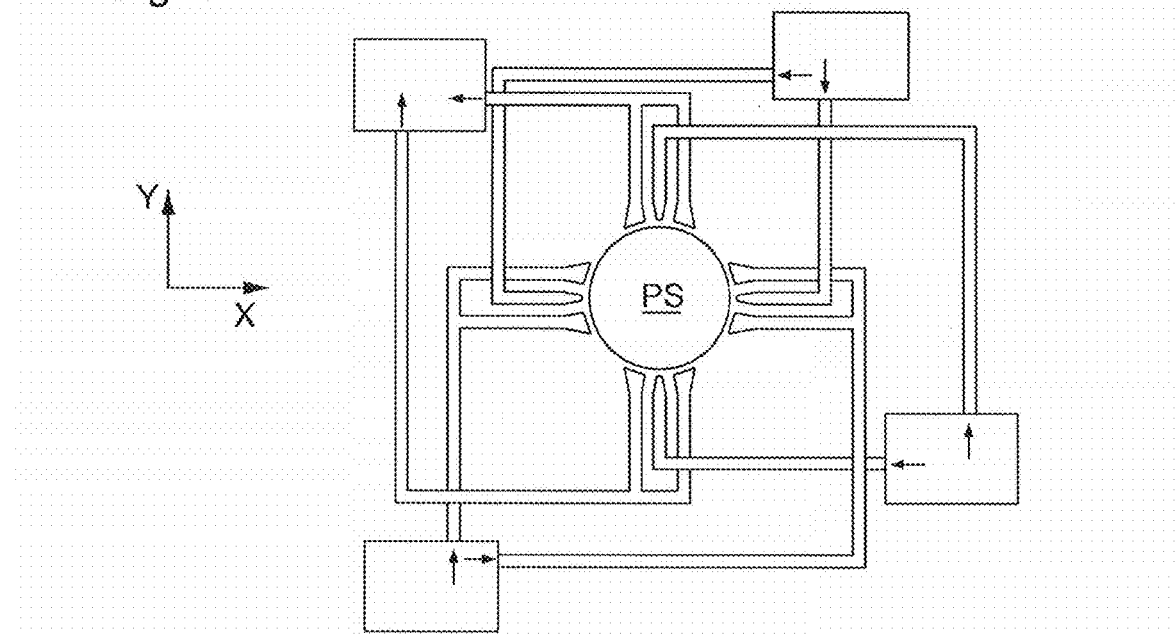
Figure 4:
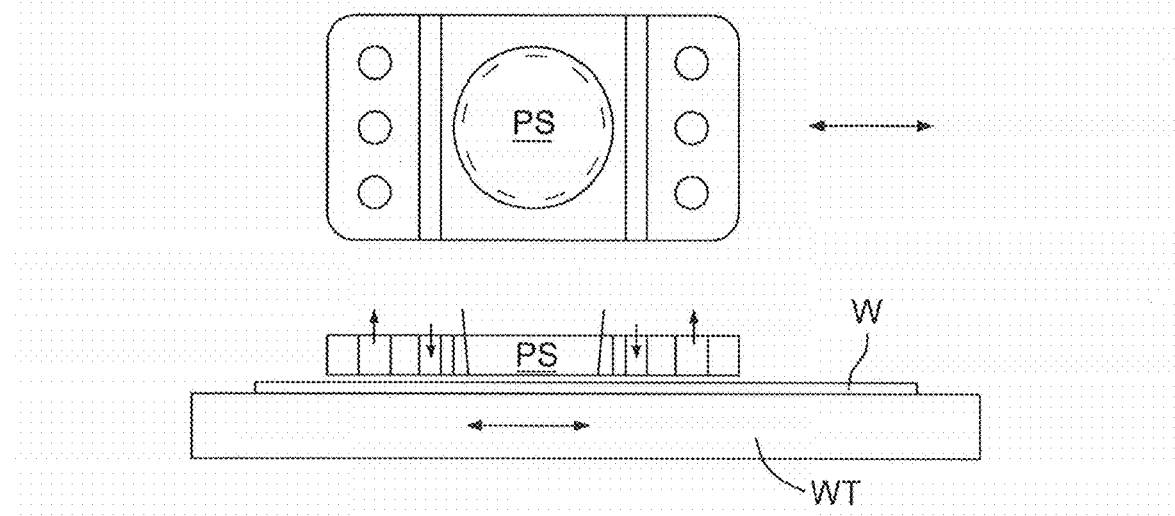
FIG. 4 depicts a further liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which substantially the whole of the substrate W and optionally part of the substrate table WT is submersed in a bath of liquid and the so called localized immersion system which use liquid supply systems in which liquid is only provided to a localized area of the substrate. In the latter category, the space filled by liquid is smaller in plan than the top surface of the substrate and the area filled with liquid remains substantially stationary relative to the projection system PS while the substrate W moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the wafer. Any of the liquid supply devices of FIGS. 2-5 can also be used in such a system. However, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Another arrangement which has been proposed is to provide the liquid supply system with a barrier member which extends along at least a part of a boundary of the space between the final element of the projection system and the substrate table. Such an arrangement is illustrated in FIG. 5.

Figure 5:
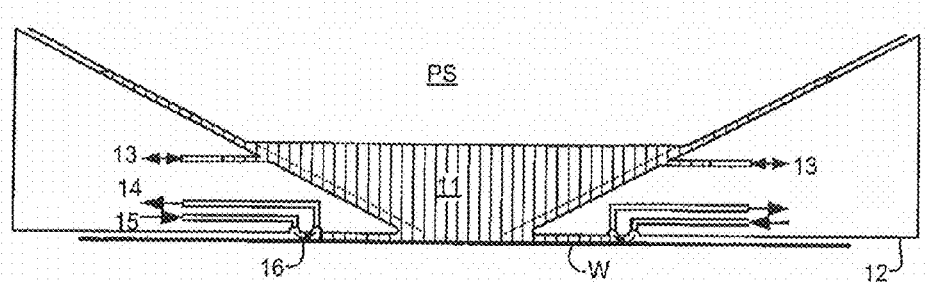
FIG. 5 depicts a further liquid supply system for use in a lithographic projection apparatus.

FIG. 5 schematically depicts a localized liquid supply system or fluid handling structure with a barrier member 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a gas seal or fluid seal.

The barrier member 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the barrier member 12 positioned below and surrounding the final element of the projection system PL. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

An embodiment of the present invention relates to a particular type of extractor for use in a fluid handling structure which aims to prevent the meniscus from advancing beyond a certain point. That is, an embodiment of the invention relates to a meniscus pinning device which pins the edge of liquid in a space between the final element of the projection system and the substrate and/or substrate table substantially in place. The meniscus pinning arrangement relies on a so-called gas drag extractor principle which has been described, for example, in United States Publication No. 2008-0212046 A1, published on Sep. 4, 2008. In that system, extraction holes are placed in a cornered shape. The corners are aligned with the stepping and scanning directions. This reduces the force on the meniscus between two outlets for a given speed in the step or scan direction compared to if the two outlets were aligned perpendicular to the direction of step or scan.

An embodiment of the present invention is an improvement on this system in that the geometry of the cornered shape in which the openings are arranged allows sharp corners (selected from the range of about 60° to 90°, desirably selected from the range of 75° to 90° and most desirably selected from the range of 75° to 85°) to be present for the corners aligned both in the scan and in the step directions. This allows increased speed in the direction of each aligned corner. This is because the creation of liquid droplets due to an unstable meniscus in the scanning or stepping direction is reduced. Where corners are aligned with both the scanning and stepping directions, increased speed may be achieved in those directions. Desirably the speed of movement in the scanning and stepping directions may be substantially equal.

Figure 6:
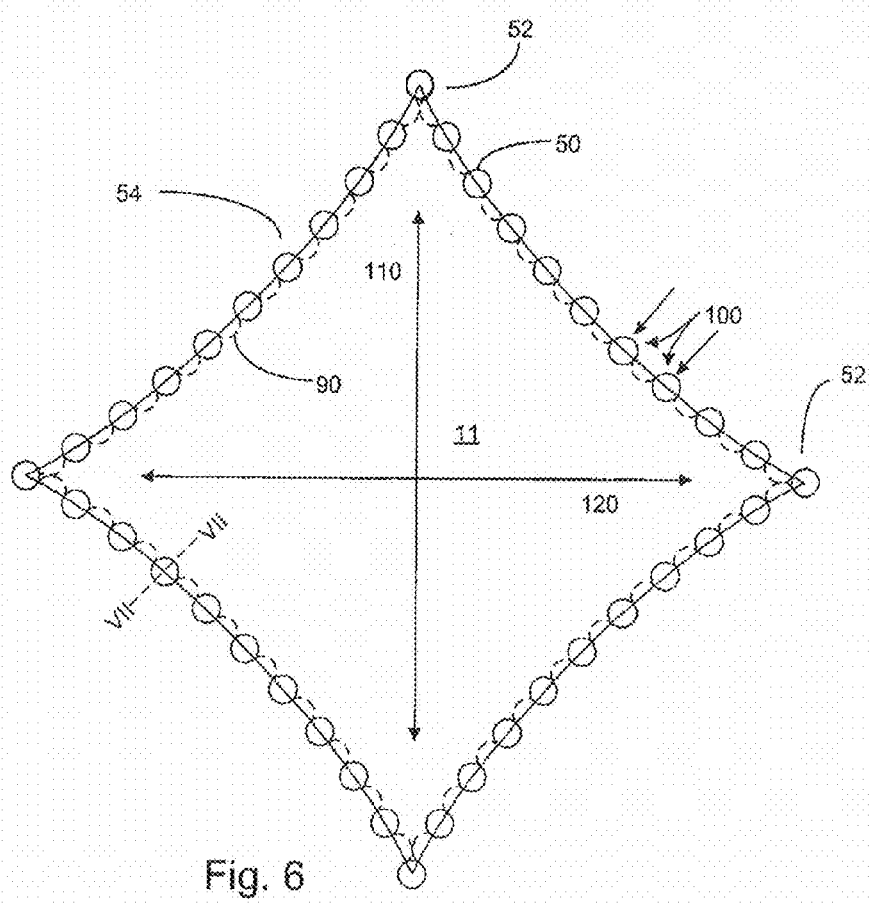
FIG. 6 is a schematic illustration, in plan, of a meniscus pinning system according to an embodiment of the present invention.

FIG. 6 illustrates schematically and in plan the meniscus pinning feature of a fluid handling structure or system of an embodiment of the present invention. The features of a meniscus pinning device are illustrated which may, for example, replace or augment the meniscus pinning arrangement 14, 15, 16 of FIG. 5. The meniscus pinning device of FIG. 6 comprises a plurality of discrete openings 50. Each of these openings 50 are illustrated as being circular though this is not necessarily the case. Indeed one or more of the openings 50 may be one or more shapes selected from the following shapes: square, rectangular, oblong, triangular, elongate slit, etc. Each opening has, in plan, a length dimension (i.e. in the direction from one opening to the adjacent opening) of greater than 0.2 mm, desirably greater than 0.5 mm or 1 mm, in one embodiment selected from the range of 0.1 mm to 10 mm, in one embodiment selected from the range of 0.25 to 2 mm. In one embodiment the width of each opening is selected from the range of 0.1 mm to 2 mm. In another embodiment the width of each opening is selected from the range of 0.25 mm to 1 mm.

Each of the openings 50 of the meniscus pinning device of FIG. 6 may be connected to a separate under pressure source. Alternatively or additionally, each or a plurality of the openings 50 may be connected to a common chamber (which may be annular) which is itself held at an under pressure. In this way a uniform under pressure at each or a plurality of the openings 50 may be achieved. The openings 50 can be connected to a vacuum source and/or the atmosphere surrounding the fluid handling structure or system (or confinement structure, barrier member or liquid supply system) may be increased in pressure to generate the desired pressure difference.

In the embodiment of FIG. 6 the openings are fluid extraction openings. That is they are inlets for the passage of gas and/or liquid into the fluid handling structure. That is, the inlets may be considered as outlets from the space 11. This will be described in more detail below. However, as will become apparent when describing the embodiments of FIGS. 14-16 the openings may equally be outlets for the passage of fluid (e.g., liquid) out of the fluid handling structure 12. That is, the openings are inlets into the space 11.

The openings 50 are formed in a surface of a fluid handling structure. That surface faces the substrate and/or substrate table, in use. In one embodiment the openings are in a flat surface of the fluid handling structure. In an embodiment, a ridge may be present on the bottom surface of the substrate member. In that embodiment the openings may be in the ridge. In an embodiment, the openings 50 may be defined by needles. The bodies of some of the needles, e.g., adjacent needles, may be joined together. The needles may be joined together to form a single body. The single body may form the corner shape.

Figure 7:
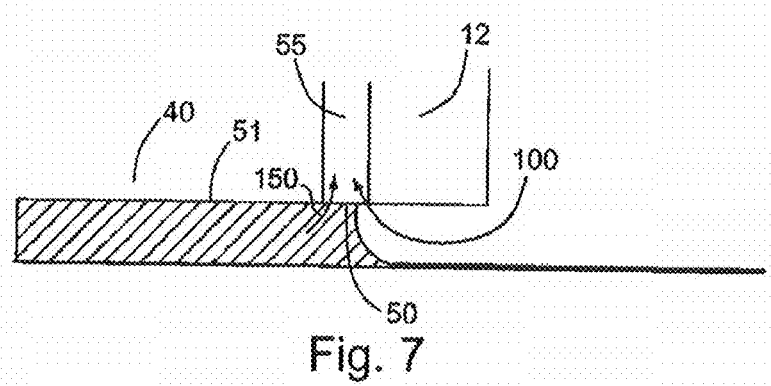
FIG. 7 depicts, in cross-section in a plane substantially parallel to the optical axis of the projection system, a meniscus pinning system according to an embodiment of the present invention.

As can be seen from FIG. 7, the openings 50 are the end of a tube or elongate passageway 55, for example. Desirably the openings are positioned such that they face the substrate W in use. The rims (i.e. outlets out of a surface) of the openings 50 are substantially parallel to a top surface of the substrate W. The openings are directed, in use, towards the substrate and/or substrate table configured to support the substrate. Another way of thinking of this is that an elongate axis of the passageway 55 to which the opening 50 is connected is substantially perpendicularly (within +/−45°, desirably within 35°, 25° or even 15° from perpendicular) to the top surface of the substrate W.

Each opening 50 is designed to extract a mixture of liquid and gas. The liquid is extracted from the space 11 whereas the gas is extracted from the atmosphere on the other side of the openings 50 to the liquid. This creates a gas flow as illustrated by arrows 100 and this gas flow is effective to pin the meniscus 90 between the openings 50 substantially in place as illustrated in FIG. 6. The gas flow helps maintain the liquid confined by momentum blocking, by a gas flow induced pressure gradient and/or by drag (shear) of the gas flow on the liquid.

The openings 50 surround the space to which the fluid handling structure supplies liquid. That is, the openings 50 are substantially continuously spaced around the space (although, as will be described below, the spacing between adjacent openings 50 may vary). This differs from United States Publication No. 2008-0007704 A1, published on Jan. 10, 2008, in which extraction openings are in four separate cornered lines rather than a cornered shape (there are no openings along part of the edges between corners). This is because in United States Publication No. 2008-0007704 A1 liquid is forced substantially tangentially towards the corners where it is extracted by gas knives. In an embodiment of the present invention liquid is extracted all the way around the cornered shape and is extracted substantially at the point at which it impinges on the cornered shape. This is achieved because the openings 50 are formed all the way around the space (in the cornered shape).

As can be seen from FIG. 6, the openings 50 are positioned so as to form, in plan, a cornered shape (i.e. a shape with corners 52). In the case of FIG. 6 this is in the shape of a square with curved edges or sides 54. The edges 54 have a negative radius. That is, they curve towards the center of the cornered shape in areas away from the corners 52.

The square has principal axes 110, 120 aligned with the major directions of travel of the substrate W under the projection system. This helps ensure that the maximum scan speed is faster than if the openings 50 were arranged in a circular shape. This is because the force on the meniscus between two openings 50 is reduced with a factor cos θ. Here θ is the angle of the line connecting the two openings 50 relative to the direction in which the substrate W is moving.

Therefore the use of a square shape allows movement in the step and scanning directions to be at a equal maximum speed. If movement in one of the directions, for example the scan direction is desired to be faster than movement in the step direction then a rhombus shape could be used. In such an arrangement the primary axis of the rhombus may be aligned with the scan direction. For a rhombic shape, although each of the corners may be acute, the angle between two adjacent sides of the rhombus, for example in the stepping direction, may be obtuse, i.e. more than 90° (for example selected from the range of about 90° to 120°, in an embodiment selected from the range of 90° to 105°, or in an embodiment selected from the range of 85° to 105°).

Thus, throughput can be optimized by making the primary axis of the shape of the openings 50 aligned with the major direction of travel of the substrate (usually the scan direction) and to have a second axis aligned with the other major direction of travel of the substrate (usually the step direction). It will be appreciated that any arrangement in which θ is different to 90° will give an advantage. Thus, exact alignment of the principal axes with the major directions of travel is not vital. It will further be appreciated that if the shape is circular, then there will always be two openings which are aligned perpendicularly to the direction of travel so that the meniscus between those two openings receives the maximum available force by movement of the substrate W.

An advantage of providing the edges with a negative radius is that the corners may be made sharper. An angle of selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to be 90°. If less than 90° were desired it would be necessary to select one direction to have corners with less than 90° with the result that the other corner would have an angle of greater than 90°. As will be described in relation to FIGS. 11 and 12, it would be possible to have the openings in a star shape in which instead of providing curved edges the edges are straight but meet at a point which lies radial inwardly of a straight line between two corners (see FIG. 11). However, as FIG. 13 shows, this arrangement may not be as successful as the case where the line joining the openings is smooth, i.e. where a line defined by the openings 50 and defining the cornered shape is continuous and has a continuously changing direction. In the star shape embodiment, the corner along the side of the shape will pin the meniscus. For a sharp corner the forces pinning the meniscus are focused on the corner, i.e. a short length of the edge of the shape. A more smoothly curved corner, for example, one with a large radius of curvature, distributes the pinning forces along a longer length of the curve of a corner i.e. around the corner. Thus, for a certain relative velocity between the substrate and the fluid handling structure, the effective meniscus pinning force applied to both corners is the same. However, for a defined length of the edge, the effective pinning force for the sharp corner is more than for the smoothly curved corner. This makes the meniscus pinned at a sharp corner unstable at a lower relative velocity between the substrate and the fluid handling structure than a meniscus pinned by the smoothly curved corner.

In an embodiment, each of the openings 50 is, in plan, spaced apart from each other at a distance selected from the range of 0.25 to 10 times their maximum plan dimension. In one embodiment the spacing between openings 50 is selected from the range of 0.1 mm to 15 mm. In another embodiment the spacing between openings is selected from the range of 1 mm to 5 mm.

FIG. 7 illustrates that the opening 50 is provided in a surface 51 of the bottom 40 of the fluid handling structure. This is however not necessarily the case and the outlets 50 may be in a protrusion from the bottom surface of the fluid handling structure. Arrow 100 shows the flow of gas from outside of the fluid handling structure into the passageway 55 associated with the opening 50 and the arrow 150 illustrates the passage of liquid from the space into the opening 50. The passageway 55 and opening 50 are desirably designed so that two phase extraction (i.e. gas and liquid) desirably occurs in an annular flow mode in which gas substantially flows through the center of the passageway 55 and liquid substantially flows along the walls of the passageway 55. This results in smooth flow with low generation of pulsations.

There may be no meniscus pinning features radially inwardly of the outlets 50. There may be no other components or meniscus pinning features radially outwardly of the openings 50. Thus, in comparison to the liquid confinement system of FIG. 5, there may be no gas inlet 15 or equivalent and the outlet 14 has been split into several discrete openings 50 each connected to, e.g., an under pressure source. The meniscus is pinned between the openings 50 with drag forces induced by gas flow into the openings 50. A gas drag velocity of greater than about 15 m/s, desirably 20 m/s is sufficient. By avoiding the need for a gas knife, the amount of evaporation of liquid from the substrate may be reduced thereby reducing both splashing of liquid as well as thermal expansion/contraction effects. However, an embodiment of the present invention is not limited to the structure illustrated and further meniscus pinning features could be present radially inwardly and/or radially outwardly of the openings 50.

At least thirty-six (36) discrete openings 50 each with a diameter of 1 mm and separated by 3.9 mm may be effective to pin a meniscus. In another embodiment, one hundred and twelve (112) openings 50 are present. The openings 50 may be square, with a length of a side of 0.5 mm. The total gas flow in such a system is of the order of 100 l/min. In an embodiment the total gas flow is selected from the range of 70 to 130 l/min.

Other geometries of the bottom of the fluid handling structure are possible. For example, any of the structures disclosed in United States patent application publication no. US 2004-0207824 could be used in an embodiment of the present invention.

Figure 8:
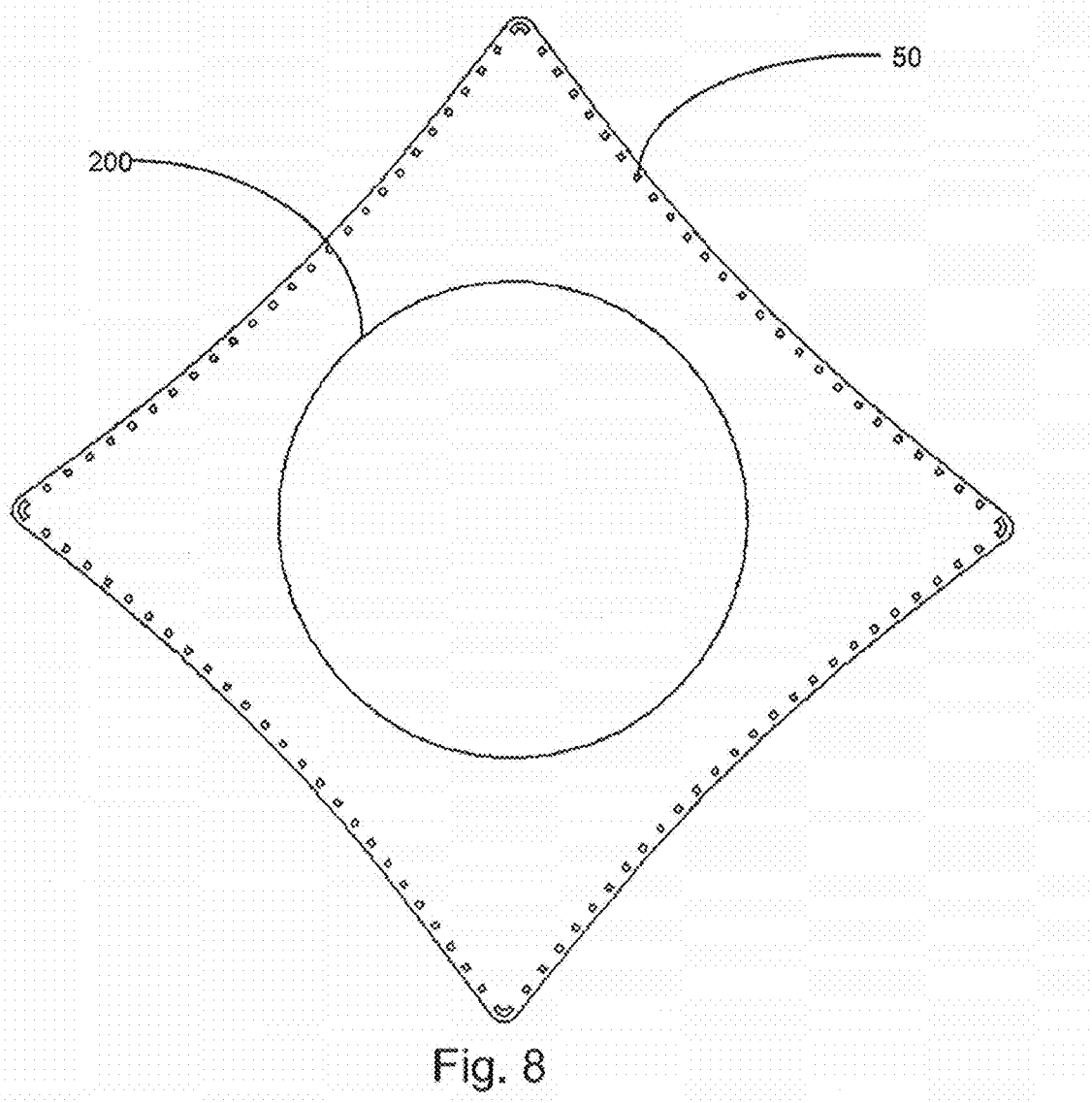
FIG. 8 illustrates, in plan, a practical embodiment of a fluid handling structure according to an embodiment of the present invention.

FIG. 8 illustrates, in plan, a practical embodiment of the present invention. In FIG. 8, the openings 50 are provided in a similar cornered shape to that of FIG. 6. However, in FIG. 8, a slightly different geometry is present. That is, the openings 50 are more dense and are smaller in width. In the FIG. 8 embodiment there are 27 openings per edge. In an embodiment the length of each edge is selected from the range of 50 to 90 mm. Each of the openings 50 is approximately square in shape, with each side having a length of 0.5 mm.

As with the embodiment of FIG. 6, there is an opening present at the apex of each corner in the embodiment of FIG. 8. This ensures that the top opening 50 of a corner has an adjacent opening on each side which is in a direction which is not perpendicular to the direction of scan or step. If two openings 50 were equally spaced on each side of the apex of the corner, the line between those two openings 50 would be perpendicular to the scan or step direction resulting in full force on the meniscus of liquid between those two openings 50. In an embodiment, each corner has a radius selected from the range of 0.05-4.0 mm. In an embodiment, the radius is selected from the range of 0.5-4.0 mm. In an embodiment, the radius is selected from the range of 1-3 mm, or selected from the range of 1.5-2.5 mm. If the radius is too large, this can decrease the liquid containment performance because instabilities in the meniscus can form resulting in leaking. Although a sharp corner (with no radius at all) does not have a decrease in containment performance, a very small radius corner may result in a less stable meniscus. Desirably the cornered shape has at least one such smoothly curved corner. In one embodiment the corner may have no radius or a radius selected from the range of 0 mm to 4.0 mm.

The negative radius of each edge is desirably zero or less. The negative radius is chosen depending upon the desired angle at the corner (60-90°) and the distance between the corners (50 mm-150 mm in one embodiment). The sides with a negative radius therefore change direction, along at least part of their length, in a continuous way. That is, there is no step change in direction. An alternative way of seeing it is that a line intersecting the openings 50 is smooth. This helps ensure that the advantage of a corner angle in the desired range can be achieved. It will be appreciated that if too small a radius is used, the tangent between two openings 50 close to the corner not aligned with the direction of travel will be closer to perpendicular to the direction of travel than for the case of a straight edge. However, the effect of a sharp corner more than compensates for this drawback.

In an embodiment, the cornered shape of the openings has four corners and four sides, each side having a negative radius of curvature. However, it may be appropriate to have other cornered shapes. For example, an eight sided shape may have advantages, for example to improve scan speed with limited layout space. The embodiments of FIG. 10 can be regarded as being eight sided, as described below.

In FIG. 8 a central opening 200 is illustrated. This central opening 200 defines the space 11. In the FIG. 8 embodiment, the central opening is circular, in plan. However, other shapes may be used, for example a shape which is the same as the shape of the openings 50 (or in the later described embodiments, the same as the shape of the further openings 105). Other shapes may also be suitable. This applies to all embodiments.

Figure 9:
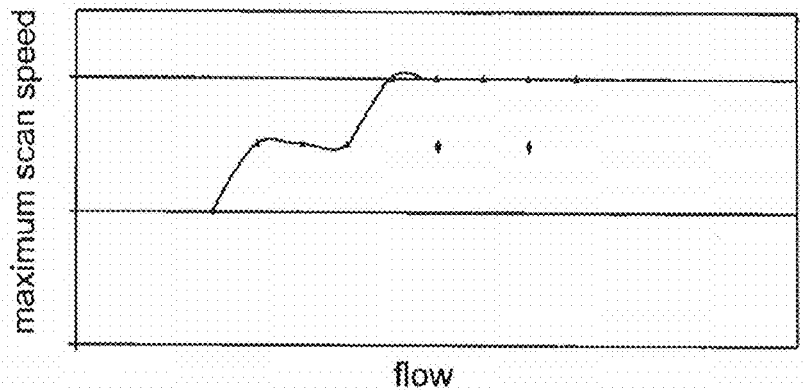
FIG. 9 is a graph illustrating the maximum achievable scan speed for different types of fluid handling structure at varying flow rates.

FIG. 9 illustrates some experimental results which illustrate an advantage of an embodiment of the present invention. The results are for two different arrangements of openings 50. During both tests, the gap between the substrate and the bottom of the fluid handling system was substantially the same. Along the X axis is the flow rate of gas through the openings and along the Y axis is the maximum scan speed before breakdown of the meniscus occurs. The diamonds illustrate the maximum achievable scan speed for openings in the form of a square with straight edges. The triangles illustrate the results in the case of the openings 50 being in a shape such as illustrated in FIG. 8 with the corners having an angle of 75° and wherein the edges are curved. The maximum scan speed was measured for the direction in which the corners with an angle of 75° point were in the direction of movement. As can be seen, the maximum achievable scan speed without liquid loss is much greater for an embodiment of the present invention than for the square with straight edges.

FIGS. 10*a-d* illustrate several different embodiments of cornered shape for the openings 50. Each cornered shape has at least a portion of at least one edge which has a negative radius of curvature. However each edge also has a portion with a positive radius of curvature. The apex of the portions with a positive radius can be seen as being corners so that the shapes are eight sided or cornered shapes. This results in each of the shapes having a central portion or corner 59 along each edge. The central position or corner 59 may be closer to a straight line 58 joining two corners 52 than other parts of the edge. The central position or corner 59 may be radially outwards from the straight line more than other portions. The straight line 58 may be considered an imaginary line as it is not present, but it is a line which is placed to connect two adjacent corners 52.

Figure 10A:
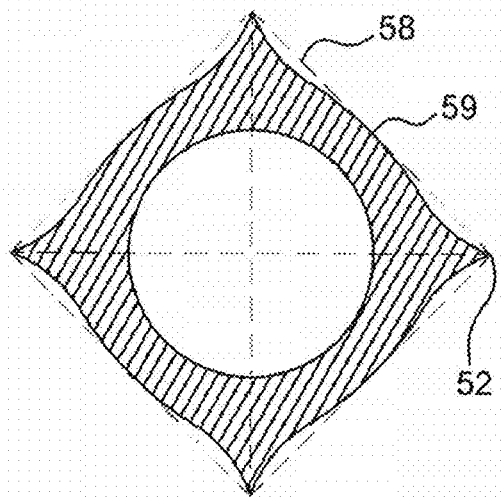
FIGS. 10a-d illustrate four variations on the embodiment of FIG. 8.

In FIG. 10*a*, the central portion 59 protrudes so that it actually lies on the straight line 58 between the two corners 52.

Figure 10B:
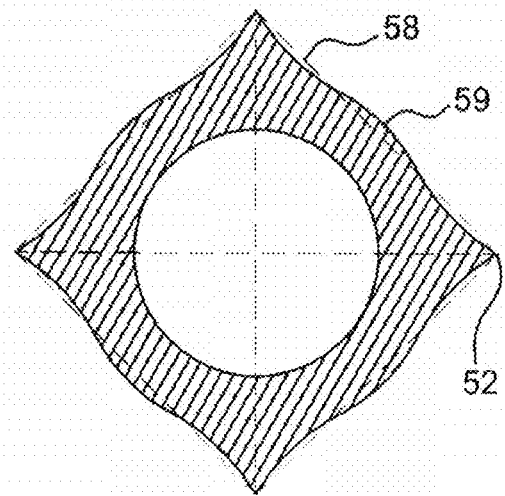

In FIG. 10*b* the central portion 59 extends beyond the straight line 58 between the two corners 52 so that it is radially further from the central axis than the straight line 58.

Figure 10C:
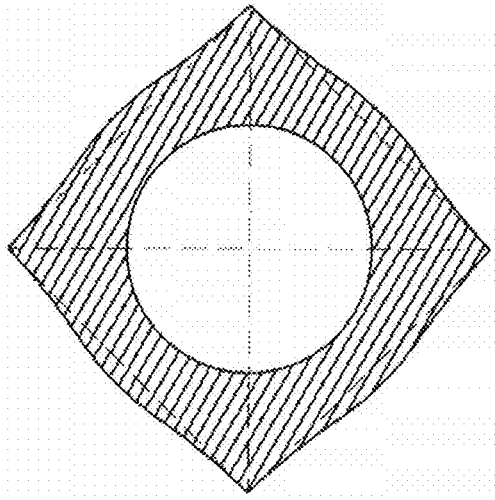

In FIG. 10*c*, all of the edge is radially further away from the central axis than the straight line 58. The FIG. 10*c* embodiment is a shape of minimal magnitude of negative radius, i.e. substantially zero. This embodiment is useful if the space for the shape is limited.

Figure 10D:
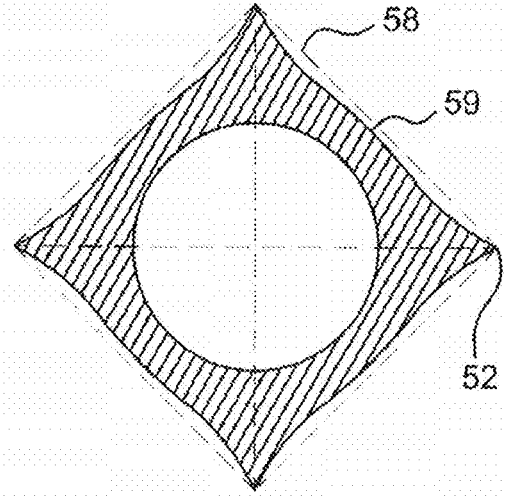

FIG. 10*d* is similar to the embodiment of FIG. 10*a* except that the central portion 59 does not quite protrude far enough so that it is closer to the central axis than the imaginary straight line 58 between the two corners 52. This demonstrates a large magnitude of negative radius.

Figure 11:
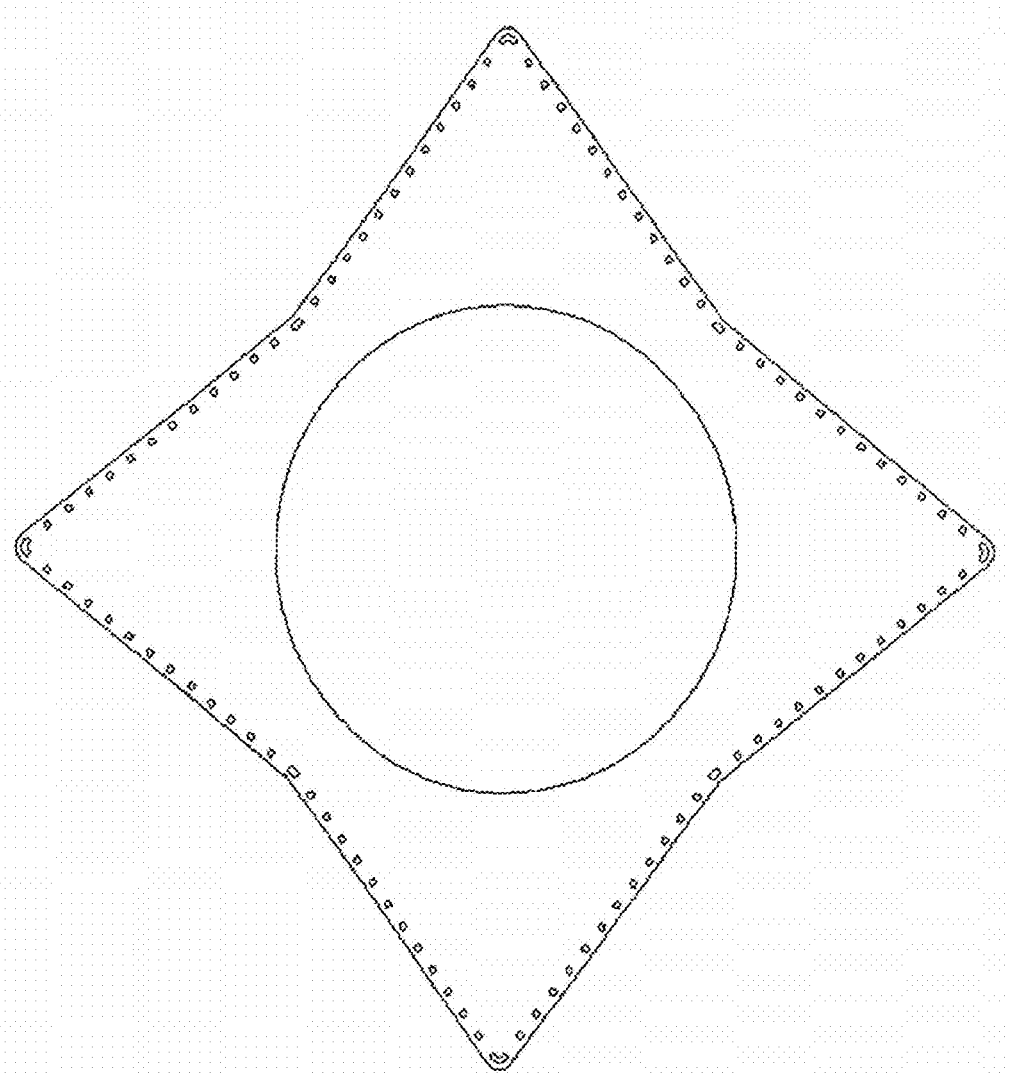
FIG. 11 illustrates a variation on the embodiment of FIG. 8.

FIG. 11 illustrates an embodiment which is similar to that of FIG. 8. Each of the corners 52 have edges which protrude radially inwardly from the straight line between the two corners 52. However, in FIG. 11 the edges each have two straight portions (and no curved portions). The straight portions converge to a point which is radially inwardly of the straight line between the two corners 52. Therefore the change in direction of the edge is abrupt (i.e. is at a point) compared to the embodiment of FIG. 8 where the change in direction is continuous. This shape may have a meniscus, especially at the point radially inward of the straight line, which is less stable than a meniscus pinned by a shape with a smoothly curved edge.

Figure 12A:
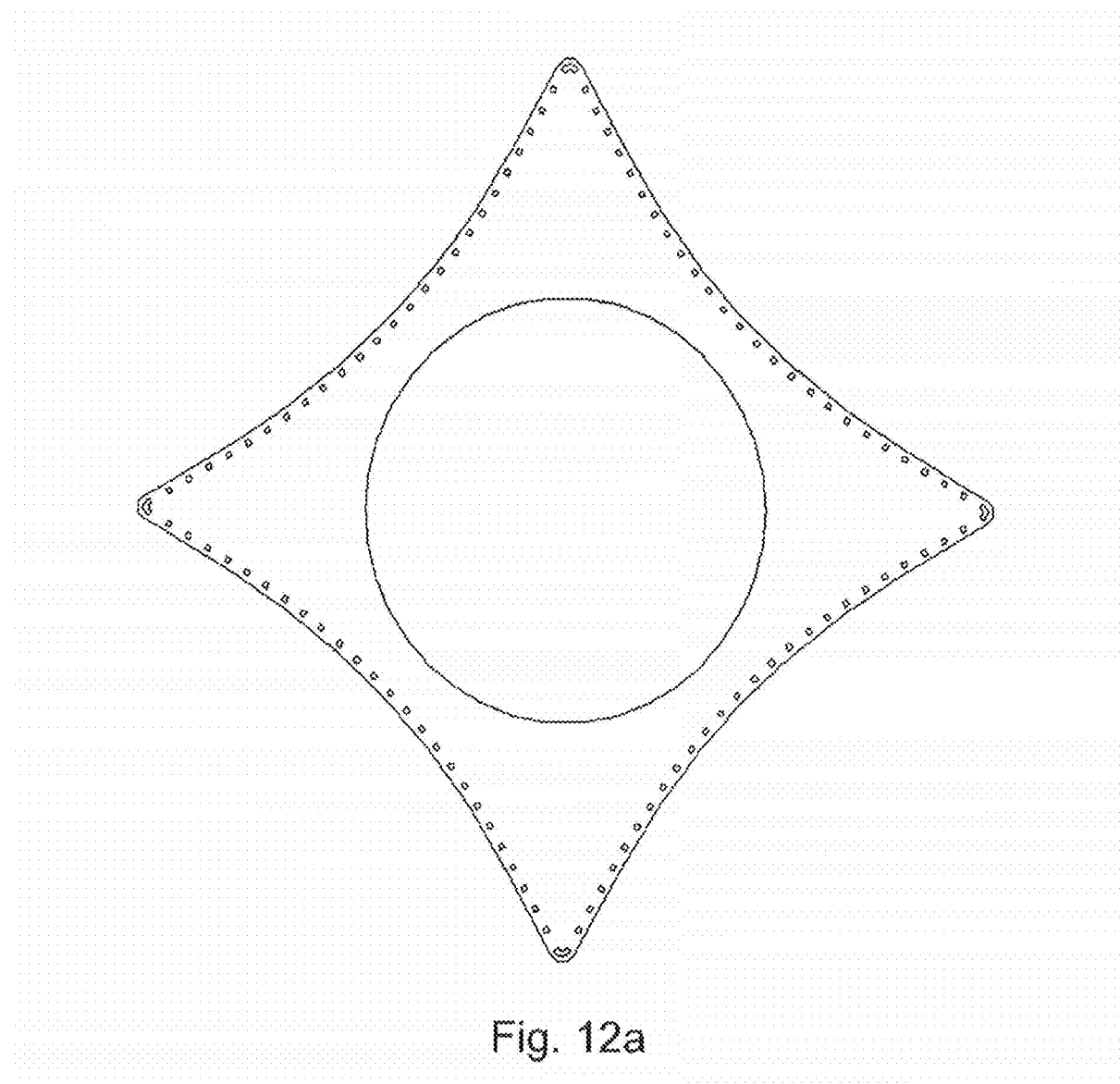
FIGS. 12a and 12b illustrate variations on the embodiments of FIGS. 8 and 11.
Figure 12B:
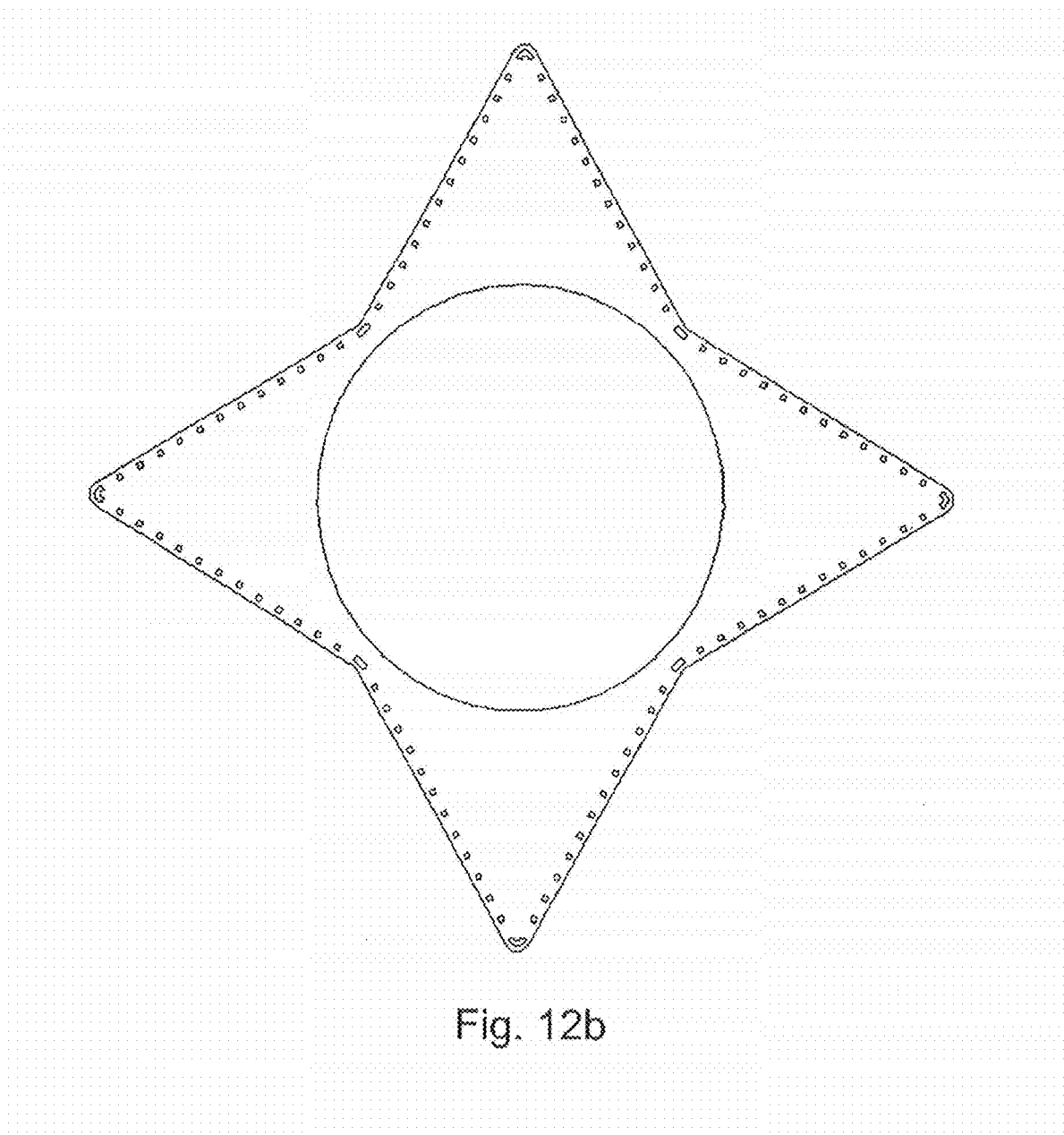
Figure 13:
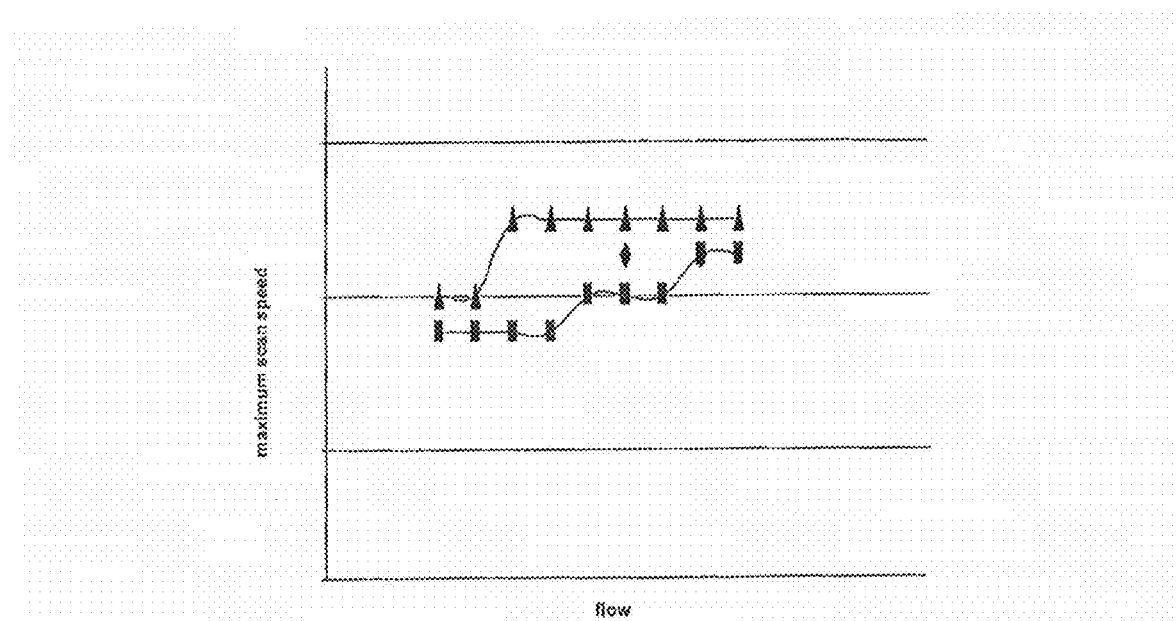
FIG. 13 illustrates maximum scan speed for three different fluid handling structures at different flow rates.

FIGS. 12*a* and 12*b* illustrate an embodiment similar to that of FIGS. 8 and 11 respectively except that the angle of each corner is 60° as opposed to 75° of FIGS. 8 and 11. This illustrates that it is possible for an embodiment of the present invention to have different angles at the corner. Best performance may be achieved with a corner with an angle selected from the range of 60° to 90°, or selected from the range of 75° to 90°, or selected from the range of 75° to 85°.

FIG. 13 illustrates experimental results which are similar to those of FIG. 9. In FIG. 13 the diamond results are produced by the same fluid handling structure as the diamond results in FIG. 9. The triangular results in FIG. 13 are for the fluid handling system of FIG. 8 (which is the same as for FIG. 9). The results illustrated with squares in FIG. 13 are for the embodiment of FIG. 11 (with the same corner angle of 75° as the triangular results) but with a discontinuous edge direction. As can be seen, the embodiment of FIG. 8 provides the best performance at a variety of flow rates. The embodiment of FIG. 11 provides the worst performance. This shows the importance of the shape of the edge being smooth (i.e. continually changing in direction) as opposed to being pointed (i.e. having an abrupt change in direction).

Figure 14:
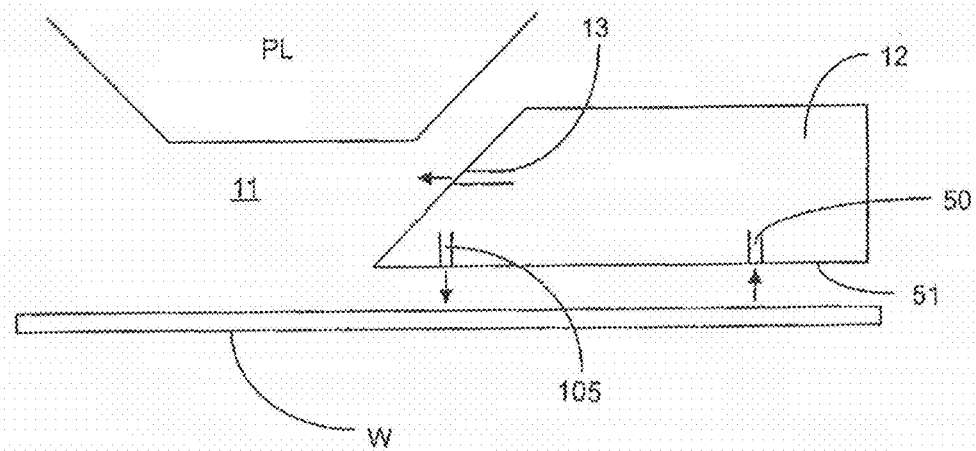
FIG. 14 is a schematic illustration, in cross-section, of a fluid handling structure according to an embodiment of the present invention.

FIG. 14 illustrates, in cross-section, part of a fluid handling structure of an embodiment of the present invention. The fluid handling structure forms a barrier 12 around the space 11 between the final element of the projection system PL and the substrate W. Liquid is provided to that space 11 mainly by inlet/outlet 13 as in the embodiment of FIG. 5. A series of openings 50 are formed in a bottom surface 51 of the barrier member 12 as described with reference to FIGS. 6-13. Also formed in the bottom surface is one or more further openings 105 which is an outlet for providing fluid (e.g. liquid) out of the fluid handling structure. The further opening 105 may be considered an inlet to provide liquid into the space 11. The liquid out of outlet 105 of the fluid handling system is directed towards the substrate W. This type of outlet has been previously provided in order to reduce the chances of bubbles being generated in the immersion liquid because of gas trapped in a gap between the edge of the substrate W and the substrate table WT. However the geometry of the outlet 105 has an impact upon the effectiveness of the fluid handling structure in containing liquid.

In particular, it is desirable that the fluid supply outlet 105 has a shape, in plan which is similar to the shape of the openings 50, in plan. Indeed, the shapes of the outlet 105 and openings 50 are desirably substantially similar. In an embodiment, each shape has, at the apex of each corner an outlet 105 or opening 50. Desirably outlet 105 is within 10 mm, desirably 5 mm of an opening 50. That is, all parts of the shape made by the openings 50 are within 10 mm of a part of the shape made by outlet 105.

Figure 15A:
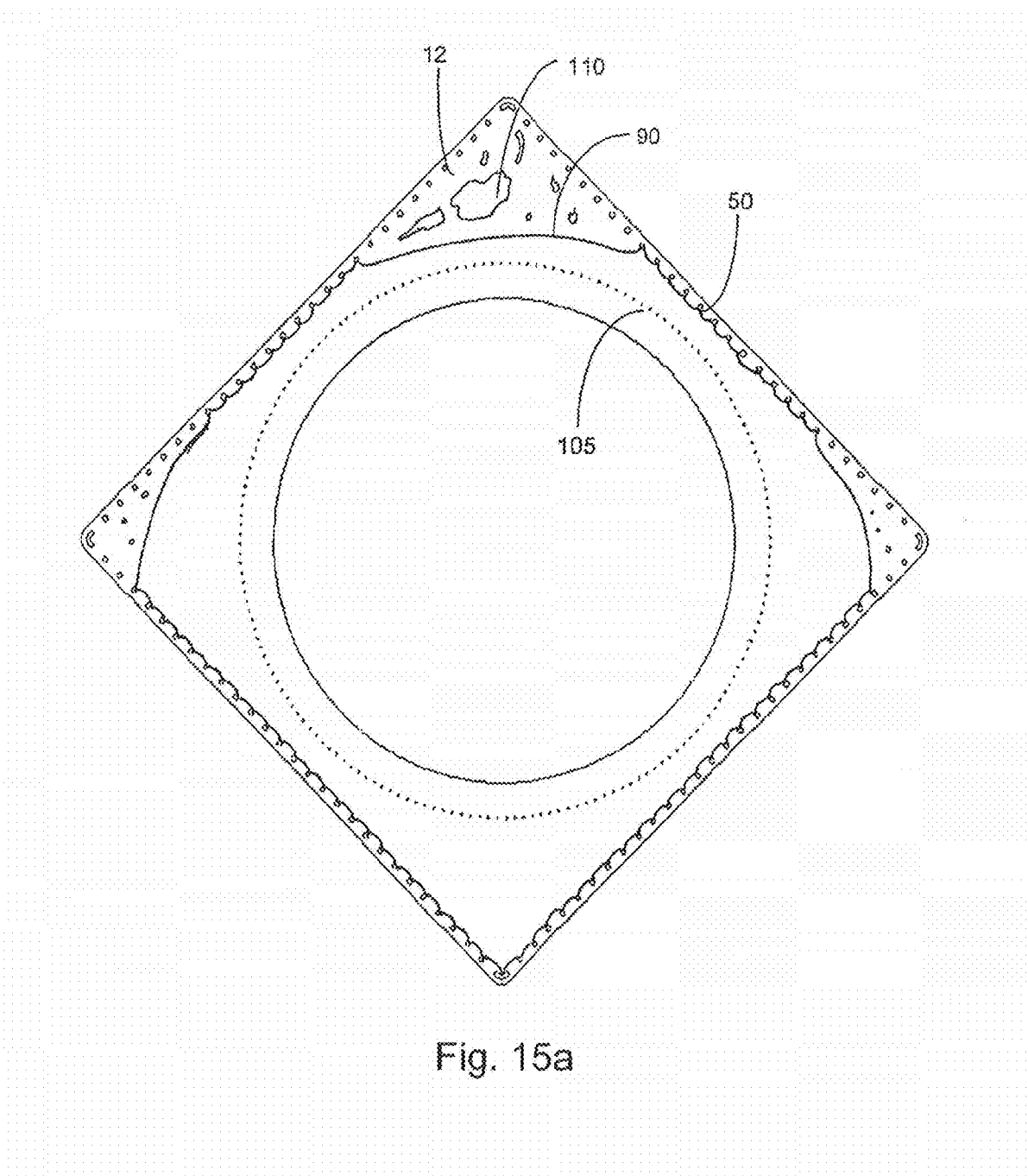
FIGS. 15a and 15b illustrate, in plan, a fluid handling structure which does not fall within an embodiment of the present invention and a fluid handling structure which does fall within an embodiment of the present invention, respectively.
Figure 15B:
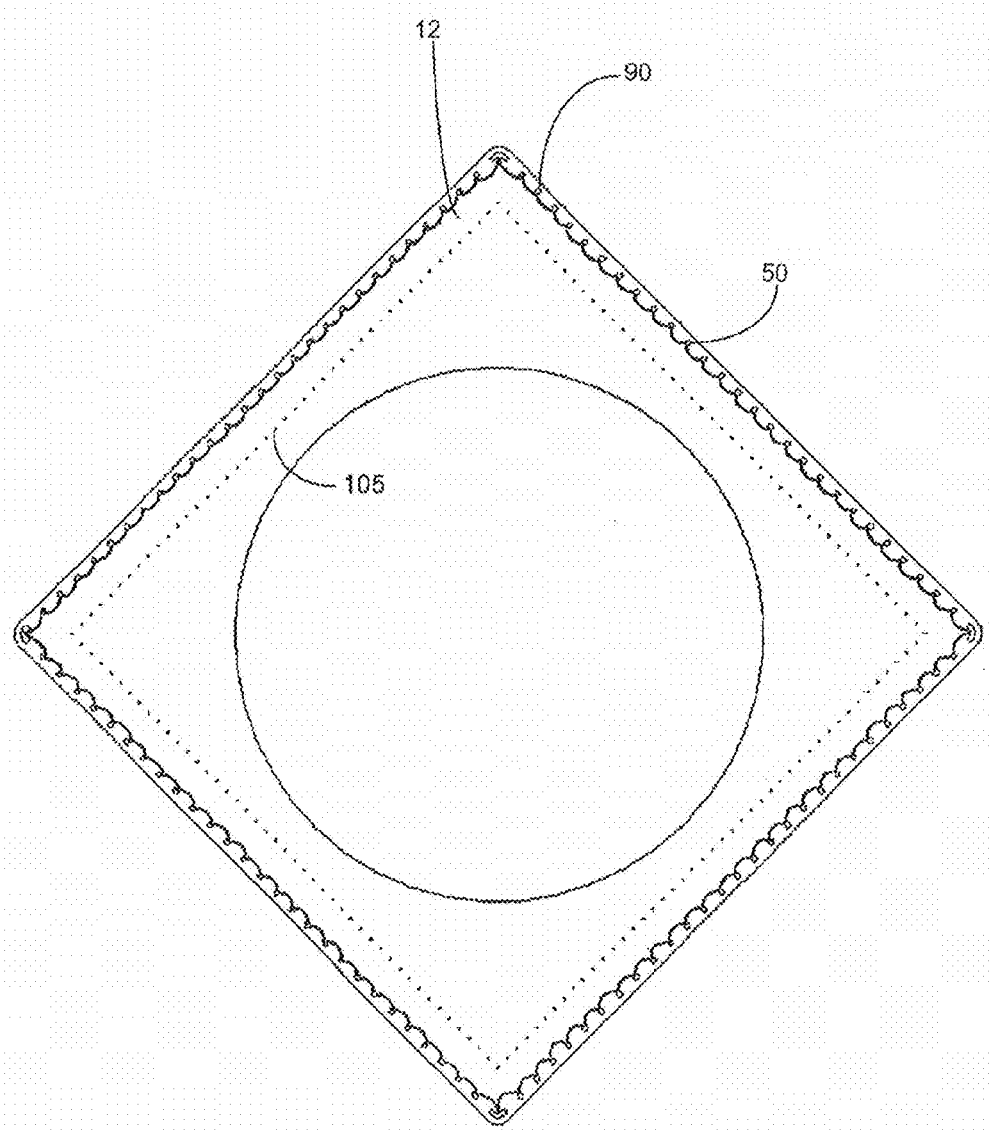

The reason for providing the outlet 105 and openings 50 with the same shape is illustrated in FIGS. 15a and 15b. In FIGS. 15a and 15b the openings 50 each have a square shape. However, in FIG. 15a the outlets 105 have a circular shape which is the same as the shape of the final element of the projection system. In contrast, in FIG. 15b the outlets 105 may have substantially the same shape as the openings 50.

FIGS. 15a and 15b are views from under a fluid handling system while the fluid handling system is being moved over a glass plate. The view is through the glass plate so that the position of the meniscus 90 can be seen relative to the openings 50 and outlets 105. In both cases illustrated in FIGS. 15a and 15b, the fluid handling system is stationary and the glass plate is being moved downwards.

As can be seen in FIG. 15a, during movement the position of the meniscus 90, particularly at the top corner, moves away from the openings 50 down towards the outlets 105. This can result in droplets 110 being left behind on the bottom surface of the barrier member 12. When the direction of relative movement of the fluid handling system 12 to the glass plate changes, the presence of the droplets can result in gas bubbles being included when those droplets 110 come into contact with the meniscus 90, e.g. collide with the meniscus. Any such bubbles can find their way into the space 11 between the projection system PL and the substrate W and thereby cause imaging defects.

In the circumstance illustrated in FIG. 15b, as can be seen, the meniscus 90 is still attached to each of the openings 50. This is because the outlets 105 have substantially the same shape, in plan, as the openings 50. Indeed, the openings 50 are closer to the outlets 105, as discussed above.

The outlet 105 is radially inwardly of the openings 50, for example with respect to the optical axis of the projection system PS. The openings 50 may be regarded as being fluid extraction inlets and the outlet 105 can be regarded as a fluid supply outlet. The openings 50 can be regarded as having a first cornered shape and the outlet 105 can be regarded as having a second corner shape. Therefore the first cornered shape and second cornered shape are arranged concentrically. The openings 50 or outlet 105 are spaced around the respective first and second cornered shape. The first and second cornered shapes may have a common center and/or axis (the optical axis). The second cornered shape is formed within the first cornered shape.

There may be less leakage of liquid coming out of the outlets 105 towards the openings 50 in the fluid handling structure of FIG. 15a than in FIG. 15b. It is believed that flow of liquid radially outwardly of the outlets 105 is at least partly responsible for the improvement in meniscus stability of the embodiment of FIG. 15b. This improvement in meniscus stability allows a faster scanning speed and thereby greater throughput.

Although an increase in scan speed is possible if a larger flow of liquid out of the outlet 105 is made. This is not desirable because of the risk of poorly thermally conditioned liquid finding its way into the space 11 between the projection system PS and the substrate W. That can lead to overlay errors. Instead, it is proposed to increase a density of outlets 105 close to the corners and to reduce the density of outlets in the middle of the edges while maintaining the total flow of liquid through the outlets 105. This helps to achieve the desired effect of maintaining a stable meniscus at a higher scan speed without increasing the total flow of liquid through the outlets 105. Alternatively, this allows the flow through the outlets to be decreased for a given maximum scan speed.

Figure 16:
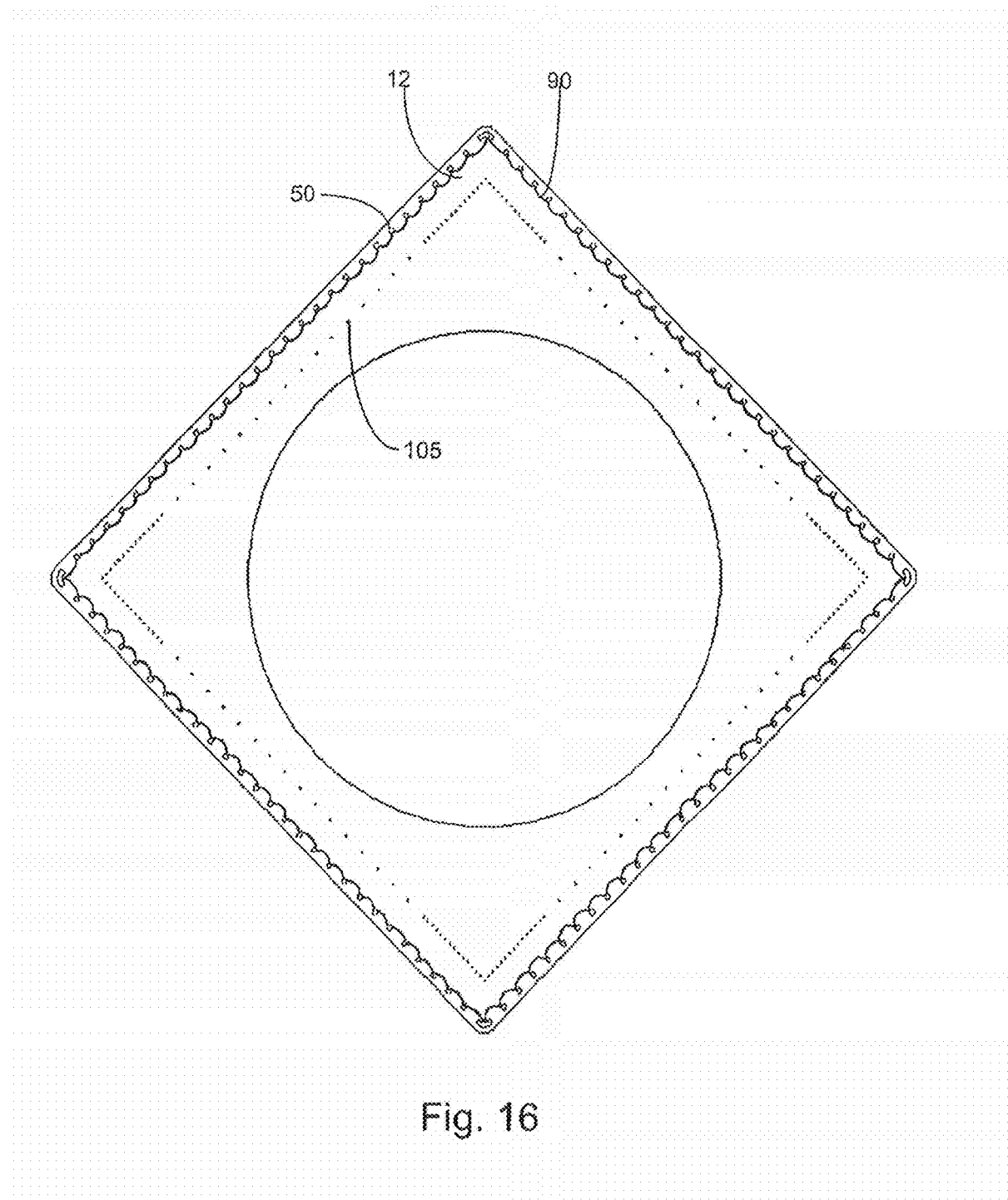
FIG. 16 illustrates, in plan, a further fluid handling system of an embodiment of the present invention.

FIG. 16 illustrates one such embodiment. It can clearly be seen that the density of outlets 105 at each of the four corners is greater than the density of outlets elsewhere. Conversely, the density of openings away from the corners (for example at the center of each edge) is typically less than 0.5 openings per mm. In one embodiment the density of openings at the corners is selected from the range of 1 to 5 times the density of openings away from the corners. In another embodiment the density of openings at the corners is selected from the range of 1 to 3 times the density of openings away from the corners.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, there is provided a fluid handling structure for a lithographic apparatus. The fluid handling structure has a plurality of openings arranged, in plan, in a cornered shape. The fluid handling structure is configured such that the openings are directed, in use, towards a substrate and/or a substrate table configured to support the substrate. The cornered shape may have a side with a negative radius. The cornered shape may have a corner with a radius selected from the range of 0.05-4.0 mm.

The cornered shape may have four corners and four sides, each side having a negative radius of curvature. The cornered shape may have a side with a negative radius and the cornered shape has at least one smoothly curved corner. The cornered shape may have a side with a negative radius that changes direction continuously along at least part of its length. The cornered shape may have a corner with a radius selected from the range of 0.05-4.0 mm. The cornered shape may have at least one smoothly curved corner. The smoothly curved corner may have a radius selected from the range of 0.5-4.0 mm. The radius may be selected from the range of 1-3 mm, or selected from the range of 1.5-2.5 mm.

The openings may be inlets for the passage of gas and/or liquid into the fluid handling structure. The openings may be outlets for the passage of fluid out of the fluid handling structure. The openings may be more closely spaced near a corner than elsewhere. A line intersecting the openings may be smooth. An opening may be present at the apex of at least one corner of the cornered shape. The openings may surround a space to which the fluid handling structure is arranged to supply fluid. The openings may be formed all the way around the space.

In an embodiment, at least one corner of the cornered shape has an angle of selected from the range of 60 to 90 degrees, or selected from the range of 75 to 90 degrees, or selected from the range of 75 to 85 degrees. The or each corner may have an angle selected from the range of 60 to 90 degrees, or selected from the range of 75 to 90 degrees, or selected from the range of 75 to 85 degrees. The cornered shape may comprise eight corners. A line defined by the openings and defining the cornered shape may be continuous and has a continuously changing direction.

In an embodiment, there is provided a lithographic apparatus comprising the fluid handling structure. In use, at least one corner of the cornered shape may point in a scanning or in a stepping direction.

In an embodiment, there is provided a fluid handling structure for a lithographic apparatus. The fluid handling structure has a plurality of fluid extraction openings arranged, in plan, in a first cornered shape, and a plurality of fluid supply openings arranged, in plan, in a second cornered shape. The fluid extraction openings and fluid supply openings are directed, in use, towards a substrate and/or a substrate table configured to support the substrate. The first and second cornered shapes are substantially similar. A fluid extraction opening is present at the apex of at least one corner of the first cornered shape and/or a fluid supply opening is present at the apex of at least one corner of the second cornered shape.

The fluid supply openings may be positioned radially inwardly of the fluid extraction openings. The first cornered shape and the second cornered shape may be arranged concentrically. The fluid supply openings may be more closely spaced near a corner than elsewhere. The fluid extraction openings or fluid supply openings may be respectively equally spaced from one another around the respective first or second cornered shape. The first and second cornered shapes may have a common center and/or axis. The second cornered shape may be formed within the first cornered shape.

The first cornered shape, or the second cornered shape, or both, may have a side with a negative radius and a smoothly curved corner. The first cornered shape, or the second cornered shape, or both, has a corner with a radius selected from the range of 0.05-4.0 mm. The first cornered shape, or the second cornered shape, or both, may have four corners and four sides, each side having a negative radius of curvature.

The fluid extraction openings and/or fluid supply openings may be formed all the way around the respective first and/or second shape. All parts of the first cornered shape may be within 10 mm of a part of the second cornered shape.

In an embodiment, there is provided a lithographic apparatus comprising the fluid handling structure. In use, at least one corner of the first and second cornered shapes may point in a scanning or in a stepping direction.

In an embodiment, there is provided a fluid handling structure for a lithographic apparatus. The fluid handling structure has a plurality of openings arranged in plan, in a cornered shape. The fluid handling structure is configured such that the openings are directed, in use, towards a substrate and/or a substrate table configured to support the substrate. The openings are more closely spaced near a corner than elsewhere.

The openings may be present at a density at a corner selected from the range of 1 to 5 times the density away from the corner. The openings may be present at a density at a corner selected from the range of 1 to 3 times the density away from the corner. The openings may be fluid supply outlets. The fluid handling structure may comprise a plurality of fluid extraction inlets radially outwardly of the openings.

In an embodiment, there may be provided a lithographic apparatus comprising the fluid handling structure. In use, at least one corner of the cornered shape may point in a scanning or in a stepping direction.

In an embodiment, there is provided a device manufacturing method. The method comprises providing a fluid between a projection system and a substrate, and retrieving liquid from between the substrate and the projection system by applying an under pressure to a plurality of openings in a fluid handling structure. The openings are arranged, in plan, in a cornered shape around the fluid between the projection system and the substrate. The cornered shape has a side with a negative radius and/or the cornered shape has a corner with a radius selected from the range of 0.05-4.0 mm.

In an embodiment, there is provided a device manufacturing method. The method comprises providing a fluid between a projection system and a substrate, retrieving liquid from between the substrate and the projection system by applying an under pressure to a plurality of fluid extraction openings in a fluid handling structure, the fluid extraction openings being arranged, in plan, in a first cornered shape, and supplying fluid to between the substrate and the projection system through a plurality of fluid supply openings. The fluid supply openings are arranged, in plan, in a second cornered shape. The first and second cornered shapes may be substantially similar. A fluid extraction opening is present at the apex of at least one corner of the first cornered shape and/or a fluid supply opening is present at the apex of at least one corner of the second cornered shape.

In an embodiment, there is provided a device manufacturing method. The method comprises supplying liquid between a projection system and a substrate through a plurality of openings of a fluid handling structure. The openings are arranged, in plan, in a cornered shape and the openings are more closely spaced near a corner than elsewhere.

In an embodiment, there is provided a fluid handing structure for a lithographic apparatus. The fluid handling structure has a plurality of fluid extraction openings arranged, in plan, in a first cornered shape, and a plurality of fluid supply openings arranged, in plan, in a second cornered shape. The fluid extraction openings and fluid supply openings are directed, in use, towards a substrate and/or a substrate table. The substrate table is configured to support the substrate. The first and second cornered shapes are substantially similar. A corner of the first cornered shape, or of the second cornered shape, or of both, is configured to be aligned, in use, with a direction of relative motion between the fluid handling structure and the substrate table.

In an embodiment, there is provided a lithographic apparatus comprising a substrate table configured to support a substrate and the fluid handling structure. The lithographic apparatus may comprise a controller configured to control a direction of relative motion between the fluid handling structure and the substrate table such that at least one corner of the first cornered shape and of the second cornered shape is aligned with the direction of relative motion.

The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithographic apparatus, the fluid handling structure having a plurality of openings arranged, in plan, in a cornered shape, the fluid handling structure configured such that the openings are directed towards a substrate and/or a substrate table configured to support the substrate, when the substrate and/or the substrate table are provided, wherein
   the cornered shape has a side with a negative radius.

2. The fluid handling structure of claim 1, wherein the cornered shape has four corners and four sides, each side having a negative radius of curvature.

3. The fluid handling structure of claim 1, wherein the cornered shape has a side with a negative radius and the cornered shape has at least one smoothly curved corner.

4. The fluid handling structure of claim 1, wherein the cornered shape has a side with a negative radius that changes direction continuously along at least part of its length, and/or the cornered shape has a corner with a radius selected from the range of 0.05-4.0 mm.

5. The fluid handling structure of claim 1, wherein the cornered shape has at least one smoothly curved corner.

6. The fluid handling structure of claim 5, wherein the smoothly curved corner has a radius selected from the range of 0.5-4.0 mm.

7. The fluid handling structure of claim 1, wherein the openings are inlets for the passage of gas and/or liquid into the fluid handling structure.

8. The fluid handling structure of claim 1, wherein the openings are outlets for the passage of fluid out of the fluid handling structure.

9. The fluid handling structure of claim 1, wherein a line intersecting the openings is smooth.

10. The fluid handling structure of claim 1, wherein an opening is present at the apex of at least one corner of the cornered shape.

11. The fluid handling structure of claim 1, wherein the openings surround a space to which the fluid handling structure is arranged to supply fluid.

12. The fluid handling structure of claim 1, wherein at least one corner of the cornered shape has an angle selected from the range of 60 to 90 degrees.

13. The fluid handling structure of claim 1, wherein the cornered shape comprises eight corners.

14. The fluid handling structure of claim 1, wherein a line defined by the openings and defining the cornered shape is continuous and has a continuously changing direction.

15. A lithographic apparatus, comprising:
a fluid handling structure having a plurality of openings arranged, in plan, in a cornered shape, the fluid handling structure configured such that the openings are directed towards a substrate and/or a substrate table configured to support the substrate, when the substrate and/or the substrate table are provided, wherein
a) the cornered shape has a side with a negative radius; and/of and
b) the cornered shape has a corner with a radius selected from the range of 0.05-4.0 mm.

16. The lithographic apparatus of claim 15, wherein, when scanning or stepping motion is performed, at least one corner of the cornered shape points in a scanning or in a stepping direction.

17. A fluid handling structure for a lithographic apparatus, the fluid handling structure having a plurality of fluid extraction openings arranged, in plan, in a first cornered shape, and a plurality of fluid supply openings arranged, in plan, in a second cornered shape, the fluid extraction openings and fluid supply openings being directed towards a substrate and/or a substrate table configured to support the substrate, when the substrate and/or the substrate table are provided, the first and second cornered shapes being substantially similar, wherein a fluid extraction opening is present at the apex of at least one corner of the first cornered shape and/or a fluid supply opening is present at the apex of at least one corner of the second cornered shape, wherein the fluid supply openings are more closely spaced near a corner than elsewhere.

18. A device manufacturing method, comprising:
providing a fluid between a projection system and a substrate; and
retrieving liquid from between the substrate and the projection system by applying an under pressure to a plurality of openings in a fluid handling structure, the openings being arranged, in plan, in a cornered shape around the fluid between the projection system and the substrate, wherein
the cornered shape has a side with a negative radius.

19. A fluid handing structure for a lithographic apparatus, the fluid handling structure having a plurality of fluid extraction openings arranged, in plan, in a first cornered shape, and a plurality of fluid supply openings arranged, in plan, in a second cornered shape, the fluid extraction openings and fluid supply openings being directed towards a substrate and/or a substrate table configured to support the substrate, when the substrate and/or the substrate table are provided, the first and second cornered shapes being substantially similar and the first cornered shape and/or the second cornered shape having a side with a negative radius,
wherein a corner of the first cornered shape, or of the second cornered shape, or of both, is configured to be aligned with a direction of relative motion between the fluid handling structure and the substrate table, such that the two sides of the corner are at a non-zero angle with respect to the direction of relative motion, when there is relative motion between the fluid handling structure and the substrate table.

* * * * *